US008228097B2

(12) United States Patent
Liao

(10) Patent No.: US 8,228,097 B2
(45) Date of Patent: Jul. 24, 2012

(54) CIRCUIT FOR DRIVING A DISPLAY PANEL USING A DRIVING CAPACITOR

(75) Inventor: Min-Nan Liao, Xindian (TW)

(73) Assignee: Sitronix Technology Corp., Hsingchu County (TW)

( * ) Notice: Subject to any disclaimer, the term of this patent is extended or adjusted under 35 U.S.C. 154(b) by 199 days.

(21) Appl. No.: 12/716,475

(22) Filed: Mar. 3, 2010

(65) Prior Publication Data

US 2010/0231271 A1 Sep. 16, 2010

(30) Foreign Application Priority Data

Mar. 13, 2009 (TW) ............................... 98108265 A

(51) Int. Cl.
*H03B 1/00* (2006.01)

(52) U.S. Cl. ........................... 327/111; 327/337; 345/50

(58) Field of Classification Search .................. 327/111, 327/337, 376–377, 365; 345/90, 50–52, 345/84

See application file for complete search history.

(56) References Cited

U.S. PATENT DOCUMENTS

| | | | | |
|---|---|---|---|---|
| 7,053,877 | B2 * | 5/2006 | Furuhashi et al. | 345/98 |
| 2005/0110719 | A1 * | 5/2005 | Satoh et al. | 345/76 |
| 2006/0220572 | A1 * | 10/2006 | Seki | 315/100 |

* cited by examiner

*Primary Examiner* — An Luu

(74) *Attorney, Agent, or Firm* — Rosenberg, Klein & Lee

(57) ABSTRACT

The present invention provides a circuit for driving a display panel using a driving capacitor, comprising an analog-to-digital converter receiving an analog input signal to generate a digital signal, a driving capacitor receiving the digital signal to generate a driving signal for the display panel, and a switching circuit in response to a switching signal, selectively coupling the analog-to-digital converter to the driving capacitor for transmission of the digital signal and coupling the driving capacitor to the display panel for transmission of the driving signal. Thus, the circuit area needed for a source driver processing images of large bit number is reduced, which decreases the cost. Further, the power system of the display having a large dynamic range of voltage can be also simplified.

9 Claims, 5 Drawing Sheets

CIRCUIT FOR DRIVING A DISPLAY PANEL USING A DRIVING CAPACITOR

BACKGROUND OF THE INVENTION

1. [Field of the Invention]

The present invention is related to a driving circuit, more particularly, to a circuit for driving a display panel using a driving capacitor, 2. [Description of the Prior Art]

As the technology advances, more and more new kinds of electronic products satisfying our different needs become commercially available. Since the conventional cathode ray tube displays have drawbacks in large volume, high power consumption and radiations harmful to frequent users, they are gradually replaced by liquid crystal displays. The LCD is superiors in small volume, low power consumption and radiation, and now becomes the most popular display used in electronic products.

Further, with the fast development of manufacture technology of display panels, the cost of touch panels is significantly reduced so that the touch panels are generally used in different kinds of consumer product, such as mobile phones, digital cameras, MP3 players, PDAs and GPS. In these kinds of products, touch panels are mainly used for a friendly user interface which improves the interaction between users and the machine, and the convenience of user's input operations.

In order to meet the supply voltage requirement of a wider and higher range, such as 2.3V~4.6V, only by using a single voltage source, and also to reduce the circuit area of the driver IC in the display, different driving schemes are provided. Examples are the application of operational amplifiers and voltage dividers. However, in those driving schemes, specific power IC and DC-DC converters become necessary, which complicates the circuitry of the driver IC and results in more externally connected components. Especially in the case of processing images of large bit number or by using all three Gamma curves (RGB), due to a large number of gray scales used, the circuit area of the digital-to-analog converter will greatly increase, which results in increase of cost of the driver IC.

Therefore, it is necessary to provide a new driving scheme whereby the circuit area needed for a source driver processing images of large bit number can be reduced, and the power system of the display having a large dynamic range of voltage can be also simplified.

SUMMARY OF THE INVENTION

The present invention provides a driving circuit of a display panel wherein the circuit area needed for a source driver processing images of large bit number can be reduced, which decreases the cost.

The present invention further provides a driving circuit of a display panel wherein the power system of the display having a large dynamic range of voltage can be simplified.

The present invention provides a circuit for driving a display panel using a driving capacitor, comprising an analog-to-digital converter receiving an analog input signal to generate a digital signal, a driving capacitor receiving the digital signal to generate a driving signal for the display panel, and a switching circuit in response to a switching signal, selectively coupling the analog-to-digital converter to the driving capacitor for transmission of the digital signal and coupling the driving capacitor to the display panel for transmission of the driving signal.

DETAILED DESCRIPTION OF PREFERRED EMBODIMENTS

FIG. 1 is a block diagram showing a source driver according to one embodiment of the present invention. The source driver 1 includes a Gamma generator 10, a first driving circuit unit 12, a second driving circuit unit 14, a third driving circuit unit 16 and a fourth driving circuit unit 18, The Gamma generator 10 generates input signals having voltage levels for corresponding gray scales using a Gamma curve, The input signals are transmitted to the first driving circuit unit 12, the second driving circuit unit 14, the third driving circuit unit 16 and the fourth driving circuit unit 18. Each of the first driving circuit unit 12, the second driving circuit unit 14, the third driving circuit unit 16 and the fourth driving circuit unit 18 generates a driving signal transmitted to a display panel 20 according to a data signal and the input signals so that the display panel 20 is driven by the driving signals. A corresponding column of pixels of the display panel 20 is driven by one of the driving signals generated by the first driving circuit unit 12, the second driving circuit unit 14, the third driving circuit unit 16 and the fourth driving circuit unit 18.

FIG. 2 shows an equivalent circuit of a pixel on the display panel. Those skill in the art will appreciate that the pixel including a TFT (thin-film transistor) coupled to a source line of the display panel has an equivalent circuit composed of a resistor 200 serially coupled to a capacitor 202.

FIG. 3 is block diagram showing a driving circuit unit according to one embodiment of the invention. As shown In FIG. 3, a circuit for driving a display panel using a driving capacitor includes an analog-to-digital converter 120, a driving capacitor 122 and a switching circuit 124. The analog-to-digital converter 120 converts an input signal into a digital signal, that is, the analog-to-digital converter 120 receives the input signals generated by the Gamma generator 10 and generates the digital signals according to a data signal. The driving capacitor 122 receives the digital signal to generate a driving signal for driving the display panel 20. The switching circuit 124, in response to a switching signal, selectively couples the analog-to-digital converter to the driving capacitor for transmission of the digital signal and couples the driving capacitor to the display panel for transmission of the driving signal. That is, the switching circuit 124 receives the switching signal generated by a timing controller (not shown), and accordingly charges or discharges the driving capacitor 122 to drive the display panel 20. Thus, in the present invention, the display panel 20 is driven by using the driving capacitor 122 rather than operational amplifier or voltage divider so that the circuit area needed for a source driver processing images of large bit number is reduced, which decreases the cost. Further, the power system of the display having a large dynamic range of voltage is also simplified. The operation of switching circuit 124 will be explained in the following.

FIGS. 4A and 4B show the operations of a driving circuit unit according to one embodiment of the invention. In response to the switching signal, the switching circuit 124 initially couples the analog-to-digital converter 120 to the driving capacitor 122 so that the digital signal is transmitted from the analog-to-digital converter 120 to the driving capacitor 122 which is thereby charged and has a driving voltage across it. As shown in FIG. 4A, by being coupled between a first and second terminal of the analog-to-digital converter 120, the driving capacitor 122 is charged to generate the driving voltage. Next, in response to the switching signal, the switching circuit 124 couples the driving capacitor 122 to the display panel 20 for transmission of a driving signal formed by the voltages across the capacitor 122. As shown in FIG. 4B, by being coupled between a third terminal of the analog-to-digital converter 120 and the display panel 20, the driving capacitor 122, the driving capacitor 122 is discharged so that the driving voltage is transmitted to a storage capacitor (not shown) of the display panel 20. Thus, the circuit area needed for a source driver processing images of large bit number is reduced, which decreases the cost. Further, the power system of the display having a large dynamic range of voltage is also simplified.

In conclusion, the present invention provides a circuit for driving a display panel using a driving capacitor, comprising an analog-to-digital converter receiving an analog input signal to generate a digital signal, a driving capacitor receiving the digital signal to generate a driving signal for the display panel, and a switching circuit in response to a switching signal, selectively coupling the analog-to-digital converter to the driving capacitor for transmission of the digital signal and coupling the driving capacitor to the display panel for transmission of the driving signal. Thus, the circuit area needed for a source driver processing images of large bit number is reduced, which decreases the cost. Further, the power system of the display having a large dynamic range of voltage is also simplified.

Figure 1:
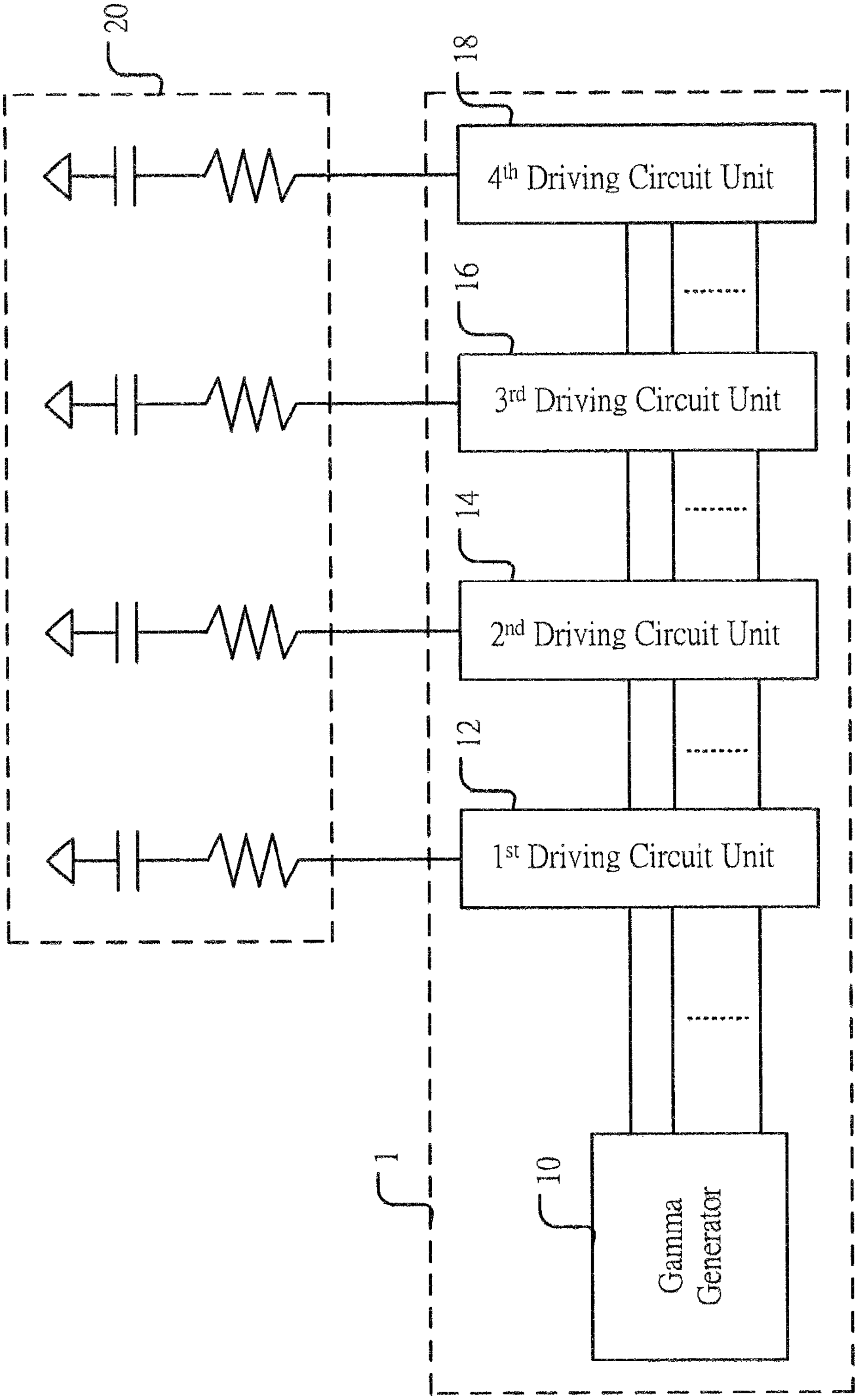
FIG. 1 is a block diagram showing a source driver according to one embodiment of the present invention.
Figure 2:
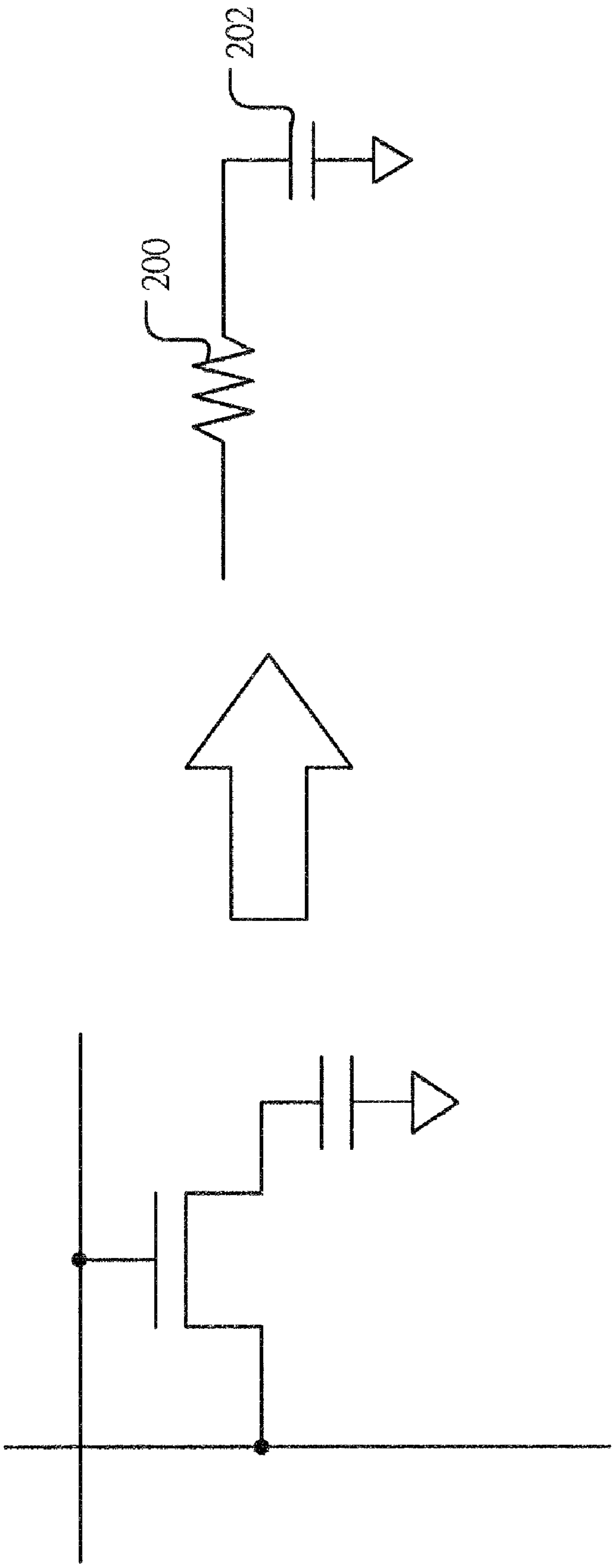
FIG. 2 shows an equivalent circuit of a pixel on the display panel.
Figure 3:
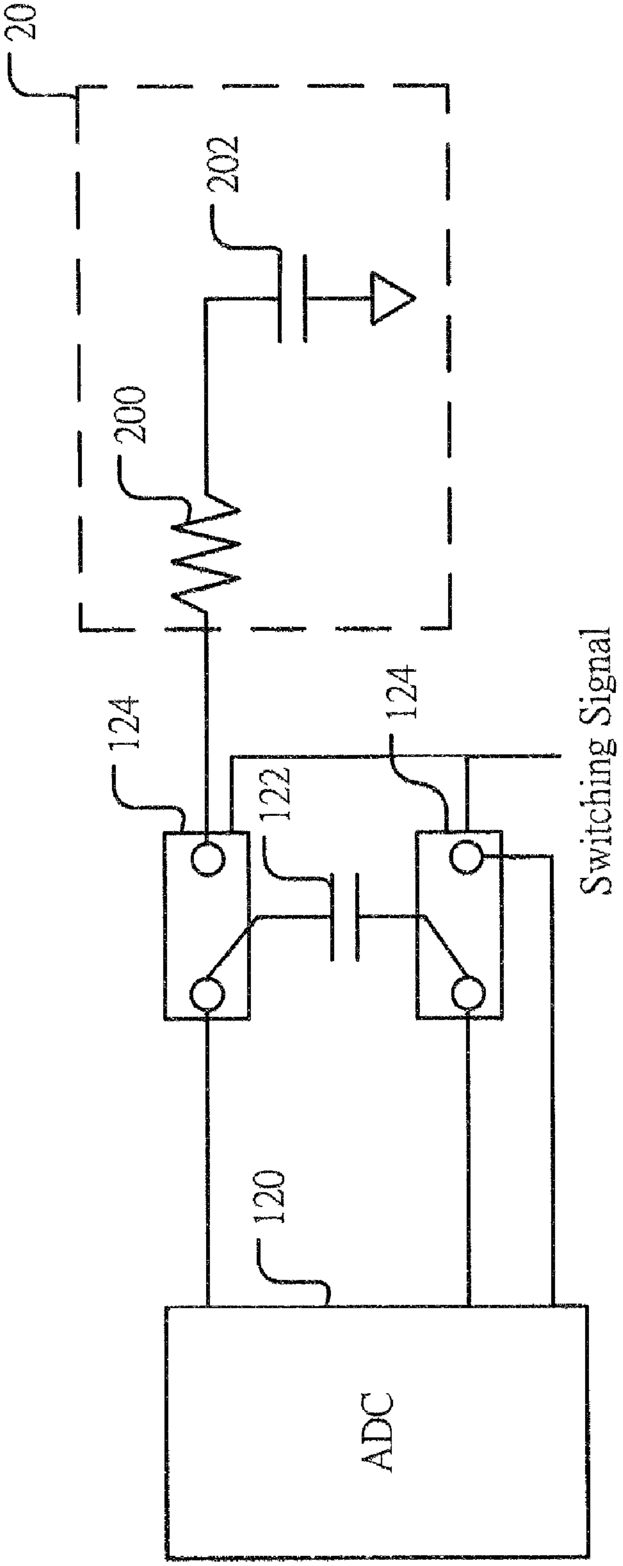
FIG. 3 is block diagram showing a driving circuit unit according to one embodiment of the invention
Figure 4A:
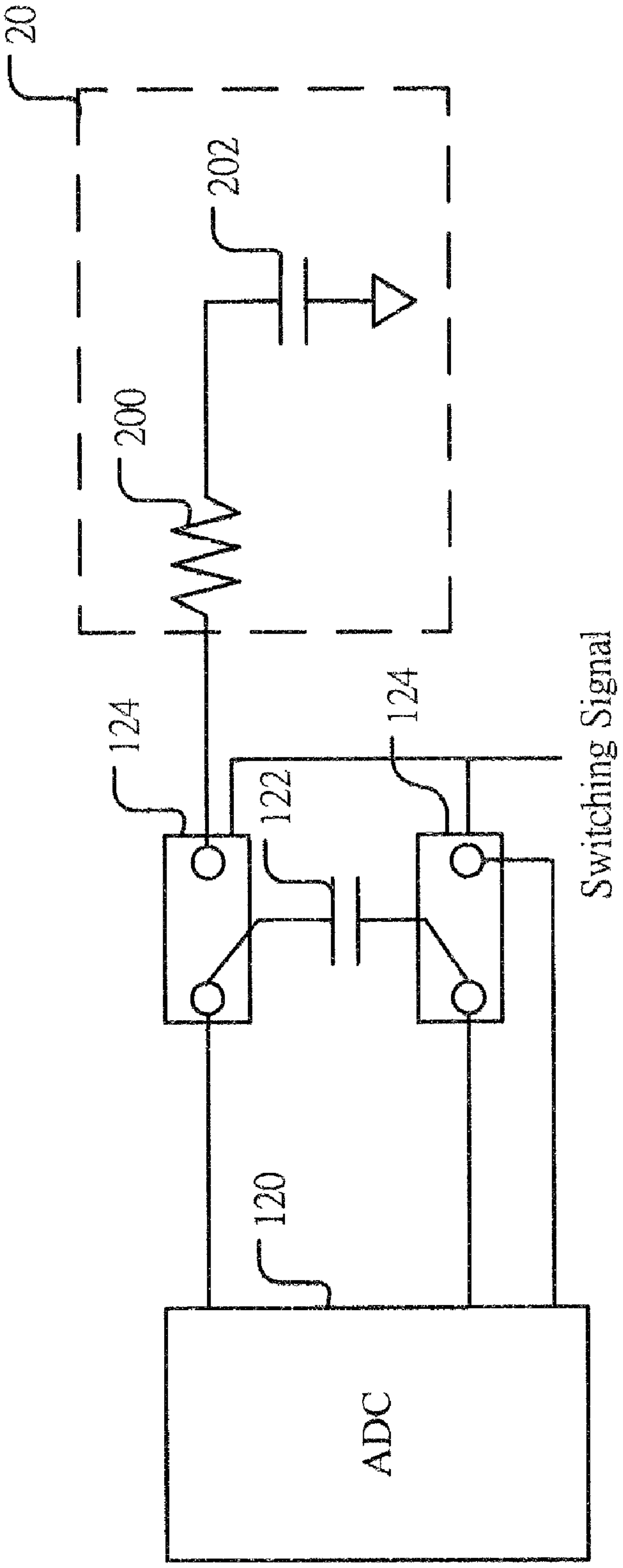
FIGS. 4A and 4B show the operations of a driving circuit unit according to one embodiment of the invention.
Figure 4B:
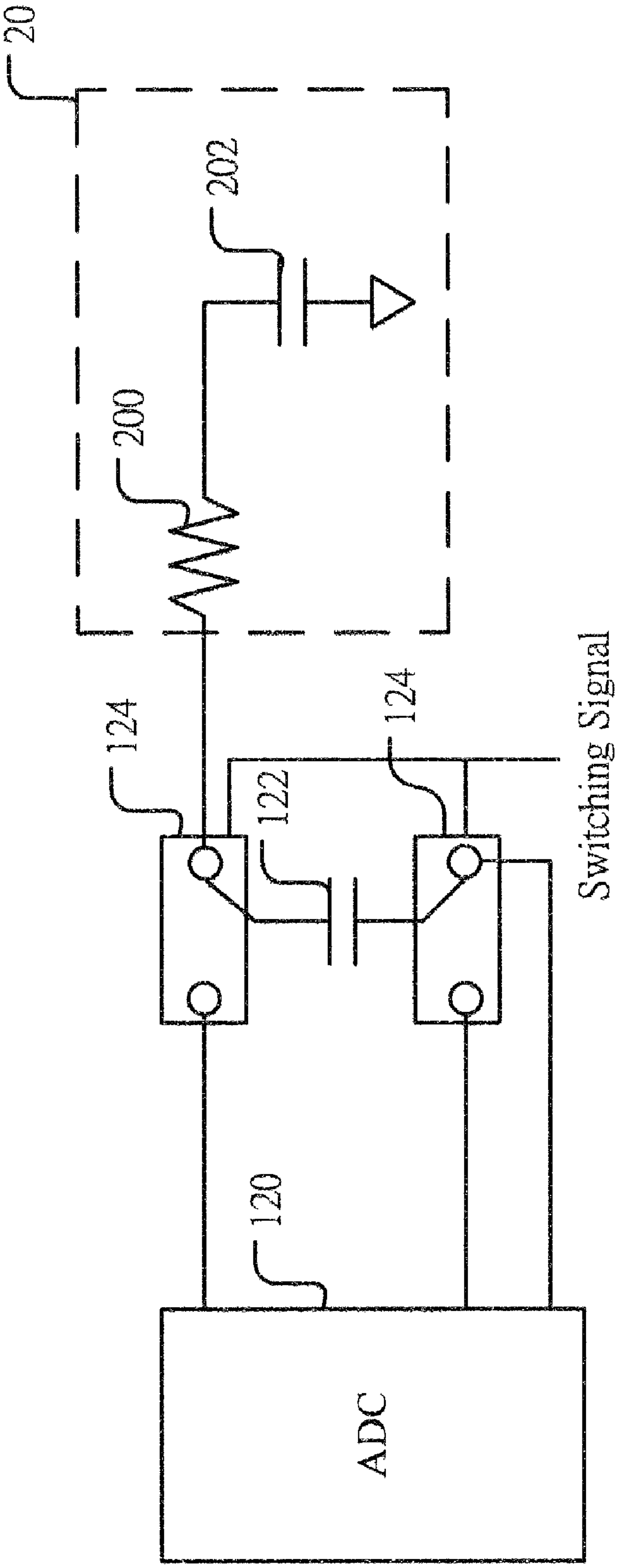

What is claimed is:

1. A circuit for driving a display panel using a driving capacitor, comprising:

an analog-to-digital converter receiving an analog input signal to generate a digital signal;

the driving capacitor receiving the digital signal to generate a driving signal for the display panel; and a switching circuit, in response to a switching signal, selectively coupling the analog-to-digital converter to the driving capacitor for transmission of the digital signal and coupling the driving capacitor to the display panel for transmission of the driving signal;

wherein, the driving capacitor is coupled between a first and second terminal of the analog-to-digital converter to receive the digital signal.

2. The circuit as claimed in claim 1, wherein a capacitor in a pixel of the display panel is driven by the driving capacitor.

3. The circuit as claimed in claim 1 further comprising: A Gamma generator, according to a Gamma curve, generating and transmitting the analog input signal to the analog-to-digital converter.

4. The circuit as claimed in claim 1, wherein the analog-to-digital converter, driving capacitor and switching circuit are disposed in a source driver of the display panel.

5. The circuit as claimed in claim 1, wherein a switching frequency of the switching circuit is determined by a timing controller.

6. The circuit as claimed in claim 1, wherein the driving capacitor is charged by the digital signal when receiving the digital signal.

7. The circuit as claimed in claim 1, the display panel is discharged by the driving signal when being driven by the driving capacitor.

8. The circuit as claimed in claim 1, the driving capacitor is coupled between a third terminal of the analog-to-digital converter and the display panel to drive the display panel.

9. The circuit as claimed in claim 1, wherein the display panel is used in a portable device.

* * * * *